United States Patent [19]

Ibrahim et al.

[11] Patent Number: 4,961,633
[45] Date of Patent: Oct. 9, 1990

[54] VLSI OPTIMIZED MODULATOR

[75] Inventors: Abd-el-Fattah A. Ibrahim, Palos Verdes Estates; Hugh P. Campbell, Gardena, both of Calif.

[73] Assignee: Xerox Corporation, Stamford, Conn.

[21] Appl. No.: 158,507

[22] Filed: Feb. 22, 1988

[51] Int. Cl.$^5$ .............................................. G02F 1/03
[52] U.S. Cl. ..................................... 350/392; 350/356; 437/209; 437/220
[58] Field of Search ........................ 350/355, 356, 392; 437/207, 209, 216, 220, 223, 224

[56] References Cited

U.S. PATENT DOCUMENTS

| 3,781,087 | 12/1973 | Nagasaki | 350/343 |
| 4,100,675 | 7/1978 | Landsittel | 437/220 |
| 4,188,708 | 2/1980 | Frederikson | 437/220 |
| 4,367,925 | 1/1983 | Sprague et al. | 350/355 |
| 4,380,373 | 4/1983 | Sprague | 350/356 |
| 4,396,252 | 8/1983 | Turner | 350/355 |
| 4,410,240 | 10/1983 | Medernach | 350/356 |
| 4,423,435 | 12/1983 | Test, II | 437/209 |
| 4,478,495 | 10/1984 | Samek | 350/392 |
| 4,613,210 | 9/1986 | Pollard | 350/356 |
| 4,636,786 | 1/1987 | Haertling | 350/392 |
| 4,709,122 | 11/1987 | Samuels | 437/224 |
| 4,784,974 | 11/1988 | Butt | 437/209 |

OTHER PUBLICATIONS

Sprague et al., "Laser Printing with Linear TIR Spatial Light Modulator", *Proceedings of the SPIE*, Apr. 19, 1983, vol. 396, pp. 44–49.

Primary Examiner—Bruce Y. Arnold
Assistant Examiner—Martin Lerner
Attorney, Agent, or Firm—Robert E. Cunha

[57] ABSTRACT

This invention relates to an electro-optic modulator device, such as a multi-gate light valve for an electro-optic line printer, wherein the different elements are uniquely combined in a package utilizing VLSI principles. A specially designed integrated circuit package is utilized to enable the bonding of one or two electro-optical devices as a single unit. As each electro-optical device has its chip pads at one end of the device, special modifications need to be made to joint the pads to the external connectors. The electro-optical crystal, which may be mounted on a glass plate, is bonded to the integrated circuit chip. Sonic bonding or the two layer metal technique may be used for the crystal to chip bonding.

8 Claims, 7 Drawing Sheets

VLSI OPTIMIZED MODULATOR

This invention relates to an electro-optic modulator device, such as a multigate light valve for an electro-optic line printer. VLSI techniques are utilized to construct an operating electro-optic modulator device in an integrated circuit package.

BACKGROUND OF THE INVENTION

It has been shown that an electro-optic element having a plurality of individually addressable electrodes can be used as a multi-gate light valve for line printing. See, for example, U.S. Pat. Nos. 4,396,252, "Proximity Coupled Electro-Optic Devices;" 4,367,925 "Integrated Electronics for Proximity Coupled Electro-Optic Devices;" and 4,380,373, "Conformable Proximity Coupled Electro-Optic Devices." Also see "Laser Printing with the Linear TIR Spatial Light Modulator," Sprague, R. A.; Turner, W. D.; Johnson, R. V., Proceedings of the SPIE; Apr. 19, 1983; 396: 44-49. These references also cite other prior art which is relevant.

These references all disclose, in various improvements of the other, attempts to create a multi-gate light valve which could be used to perform line printing on a photosensitive recording medium, such as xerographic photoreceptor which is exposed in an image configuration as it advances in a cross line direction relative to the light valve. More particularly, to carry out the exposure process, a sheet-like collimated light beam is transmitted through the electro-optic element of the light valve, either along its optical axis for straight through transmission or at a slight angle relative to that axis for total internal reflection. Successive sets of digital bits or analog signal samples (data samples), which represent respective collections of picture elements or pixels for successive lines of the image, are sequentially applied to the electrodes. As a result, localized electronic bulk or fringe fields are created within the electro-optic element in the immediate vicinity of any electrodes to which non-reference level data samples are applied. These fields, in turn, cause localized variations in the refractive index of the electro-optic element within an interactive region (i.e., a light beam illuminated region of the electro-optic element which is subject to being penetrated by the electric fields). Thus, the phase front or polarization of the light beam is modulated in accordance with the data samples applied to the electrodes as the light beam passes through the interaction region. Schlieren readout optics may be used to convert a phase front modulated light beam into a light beam having a correspondingly modulated intensity profile. That is, the modulated light beam is converted into a correspondingly modulated intensity profile to image or project the light beam onto the recording medium.

A previous attempt at a reduction to practice of this technology resulted in FIGS. 3 and 4 of U.S. Pat. No. 4,380,373, noted alone. In those figures, herein incorporated by reference, the light valve 12 includes an electro-optic element 17 and a plurality of individually addressable electrodes 18a–18i. For a total internal reflection (TIR) mode of operation, the electro-optic element 17 is a suitable cut crystal of, say, LiNbO3, lithium niobate, having an optically polished reflecting surface 21 which is integral with and disposed between optically polished input and output faces 22 and 23, respectively. The electrodes 18a–18i are ultimately coupled to the electro-optic element 17 adjacent the reflecting surface 21 and are distributed across essentially the full width thereof. If the electrodes are aligned parallel to the optical axis of the electro-optic element 17, the light valve 12 will produce a diffraction pattern which is symmetrical along the zero order diffraction component. If, on the other hand, the electrodes are of the Bragg angle relative to the optical axis of the electro-optic element 17, the light valve 12 will produce an asymmetrical diffraction pattern.

This embodiment described in the above referenced patents utilizes an integrated circuit 41 which is resiliently biased against the reflective surface 21 of the electro-optic element 17, thereby causing the electrodes 18a–18i to generally conform to the contour of the mating surface 21. As in other proximity coupled electro-optic devices, there is a clamp or similar bonding agent, which is schematically represented by arrows 44 and 45, for maintaining the electrode bearing surface of the integrated circuit 41 in pressure contact with the reflective surface 21. Additionally, there is a resilient pressure pad 51 or the like for applying a more or less uniform bias to the electrode bearing portion of the integrated circuit 41 so that it flexes as required to cause the electrodes 18a–18i to closely conform to the contour of the reflective surface 21. The improved conformance of the electrodes 18a–18i to the mating or reflective surface 21 of the electro-optic element 17 increases the uniformity with which the fringe fields 28 are coupled into the electro-optic element 17, thereby increasing the spatial uniformity of the electro-optic response of the light valve 12.

According to the present invention, the different elements shown in the prior art are uniquely combined in a package utilizing VLSI principles. A specially designed integrated circuit package is utilized to enable the bonding of one or two electro-optic devices as a single unit. As each electro-optic device has its chip pads at one end of the device, special modifications need to be made to join the pads to the external connectors. The electro-optic crystal, which may be mounted on a glass plate, is bonded to the integrated circuit chip. Sonic bonding or the two layer metal technique may be used for the crystal to chip bonding.

DESCRIPTION OF THE DRAWINGS

For a more complete understanding of the invention, reference may be made to the following detailed description of the invention in conjunction with the drawings wherein.

DETAILED DESCRIPTION OF THE INVENTION

Figure 1A:
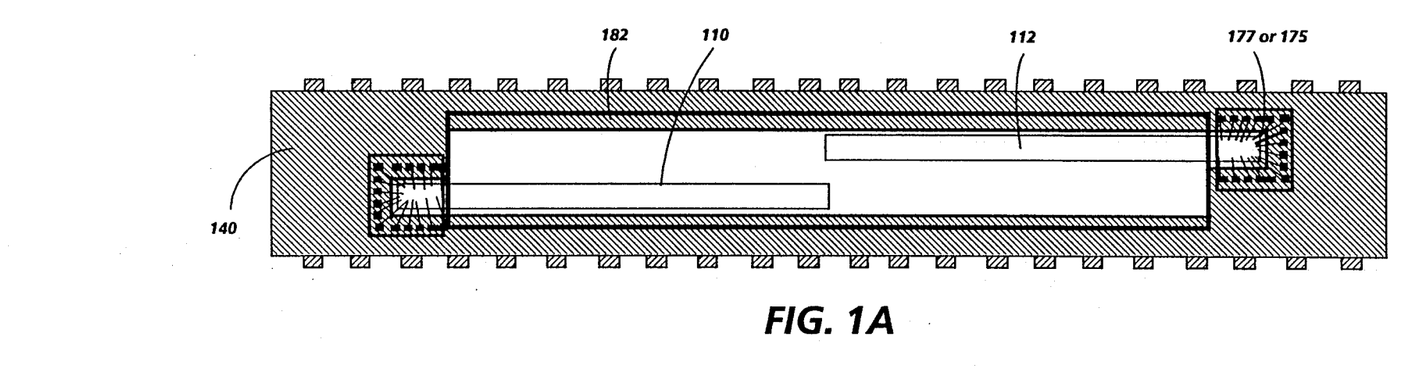
FIGS. 1A, 1B, and 1C are top, front, and side views of a two chip electro-optic modulator constructed in accordance with one embodiment of the principles of the present invention.
Figure 1B:
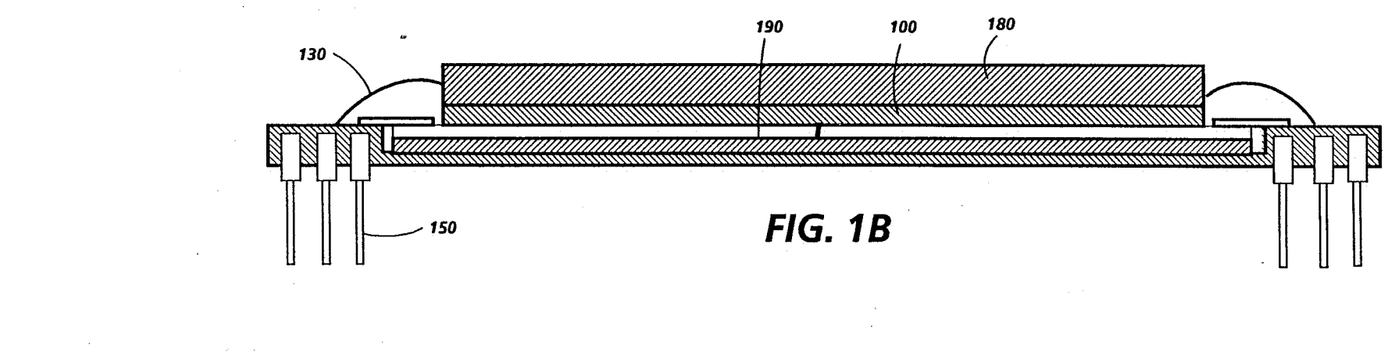
Figures 1C, 2A:
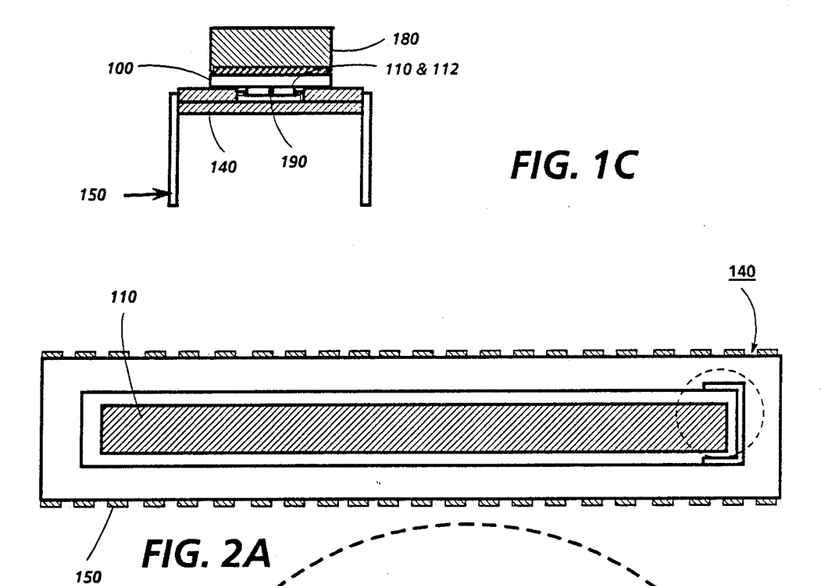
Figure 6A:
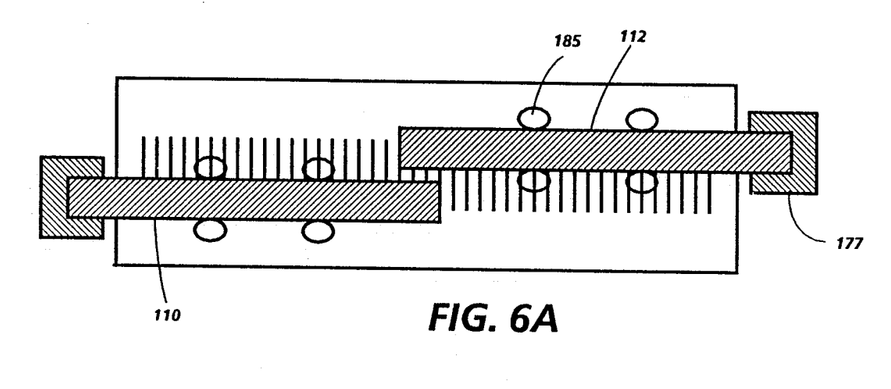
FIGS. 6A and 6B are top and side views of the crystal, chips and glass backing sub assembly used in the modulator set forth in FIG. 1.
Figure 6B:
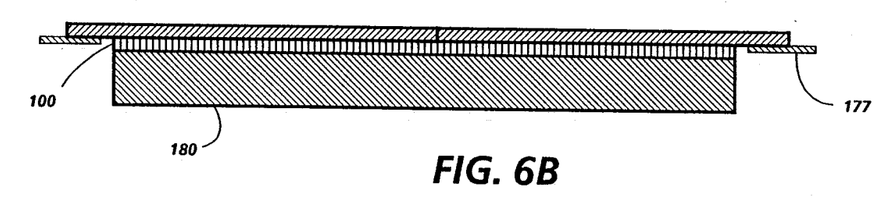

FIGS. 1A, 1B, and 1C are top, front, and side views, respectively, of the present invention and show the actual construction of one embodiment of the electro-optic VLSI optimized modulator in accordance with this invention. These figures show a typical ceramic package 140 with standard input/output pins 150. Chips 110 and 112 are seen as mounted inside the ceramic package, but FIG. 1A shows them to be offset and overlapping. This is to provide for continuous scanning on the output medium without seam interruptions. Otherwise, the output copy would have a blank band vertically on the page. The offset aspect is necessary due to the fact that manufacture of the integrated circuit chips will not approach a satisfactory output level yield. So, instead of using one output integrated circuit, two chips are utilized. The chips 110 and 112 are shown in place with either wire bonds 175 or TAB 177 linking the electrodes on the integrated circuits 110 and 112 to the input/output pins 150 of the integrated circuit package 140. Each lead on the integrated circuit package 140 would be connected to one of the input/output pins 150. Integrated circuit chips 110 and 112 would be mounted in the package and the leads on their pads would be connected, as set forth above, to the individual pads in the integrated circuit package 140. The crystal 100, glass backing 180 and aligned integrated circuits 110 and 112 are shown to be mounted directly upon the ceramic integrated circuit package 140. Glue areas 182 are shown, which bond the crystal to the top of the integrated circuit package 140. The crystal 100, glass backing 180 and aligned integrated circuits 110 and 112 are normally provided as a sub-assembly as shown in FIGS. 6A and 6B. Inside the ceramic integrated circuit package 140, would be placed an elastomer material 190. This elastomer, which provides a means to apply pressure to ensure uniform contact between the electrodes of the integrated circuit chips 110 and 112 to the crystal 100 in a direct manner. Without the elastomer, the slot in the package would have to be highly accurate, as would the bottom surfaces of integrated circuits 110 and 112. Thus, the elastomer 190 serves to ensure uniform contact of chip to crystal while allowing package tolerances to be relaxed. To protect the wire bonds 175 or TAB 177, an encapsulent 130 would be placed on and around the interconnection areas and the edges of crystal 100. This encapsulent could be any low mobile ion integrated circuit encapsulent readily available in the marketplace.

Figure 2B:
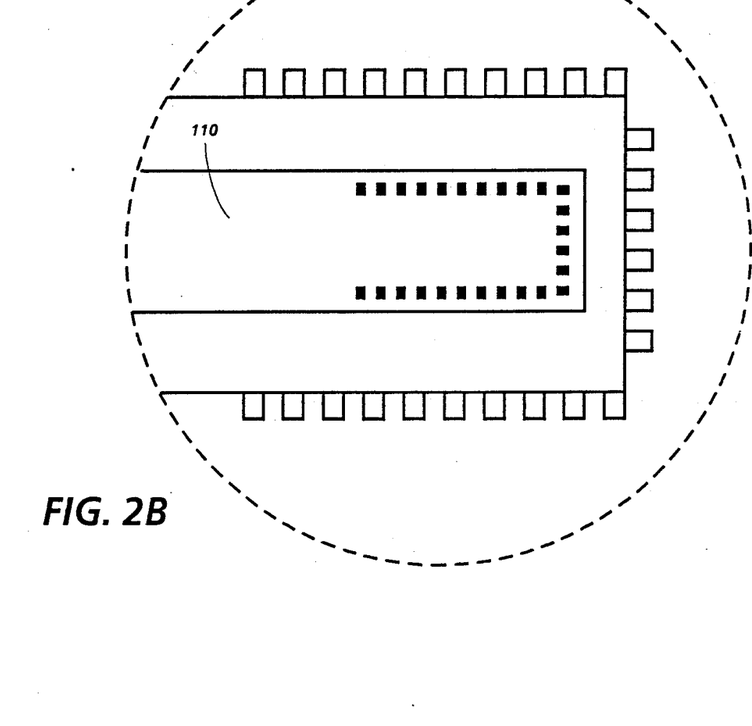
FIG. 2 is a top view of the package design for a single chip electro-optic modulator.

FIG. 2 shows a top view of a VLSI package containing only one electrode integrated circuit 110 mounted in the ceramic package 140. In the blow-up of FIG. 2, the one end of the electrode integrated circuit 110 containing the input and output connections are clearly seen. The other end could have input and output connections also, but would not be needed. Having all the connecting points on one end is advantageous in that with the leads at one end of the electrode integrated circuit 10, more room on the chip is left for the electrodes. Shown also in FIG. 2 are the spacing dimensions for the integrated circuit connecting sockets. The lead pads are 25 microns in size on 25 micron centers.

Figure 3A:
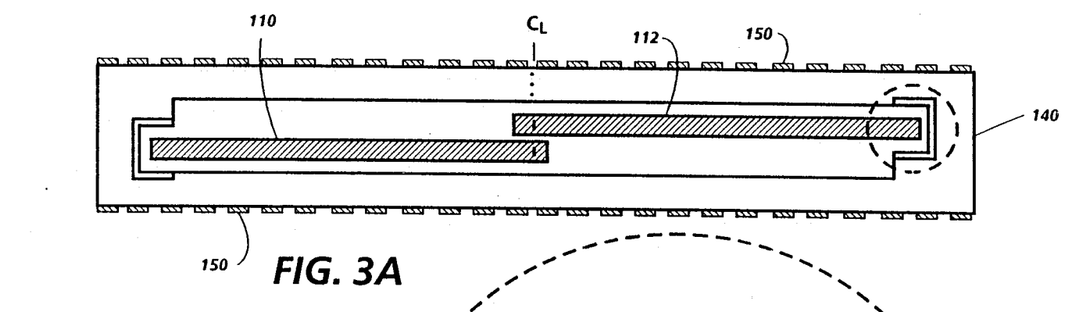
FIG. 3 is a top view of the package design for a two chip electro-optic modulator.
Figure 3B:
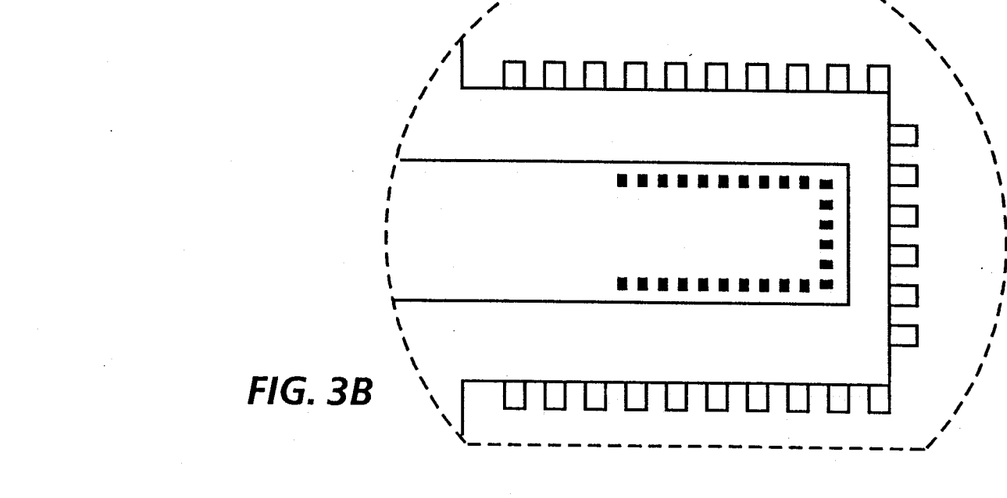

FIG. 3 is the top view of a VLSI package containing two electrode integrated circuits 110 and 112. Here, however, the integrated circuits are offset slightly and are overlapping so that the last electrode of integrated circuit 110 and the first electrode of integrated circuit 112 are only separated by 10 microns so as to ensure a continuous scanned light beam at the photosensitive surface to eliminate any vertical striping down an output page. The pads for the electrode connecting points would be at the left or outward edge of integrated circuit 110, and the right or outward edge of integrated circuit 112.

Figure 4:
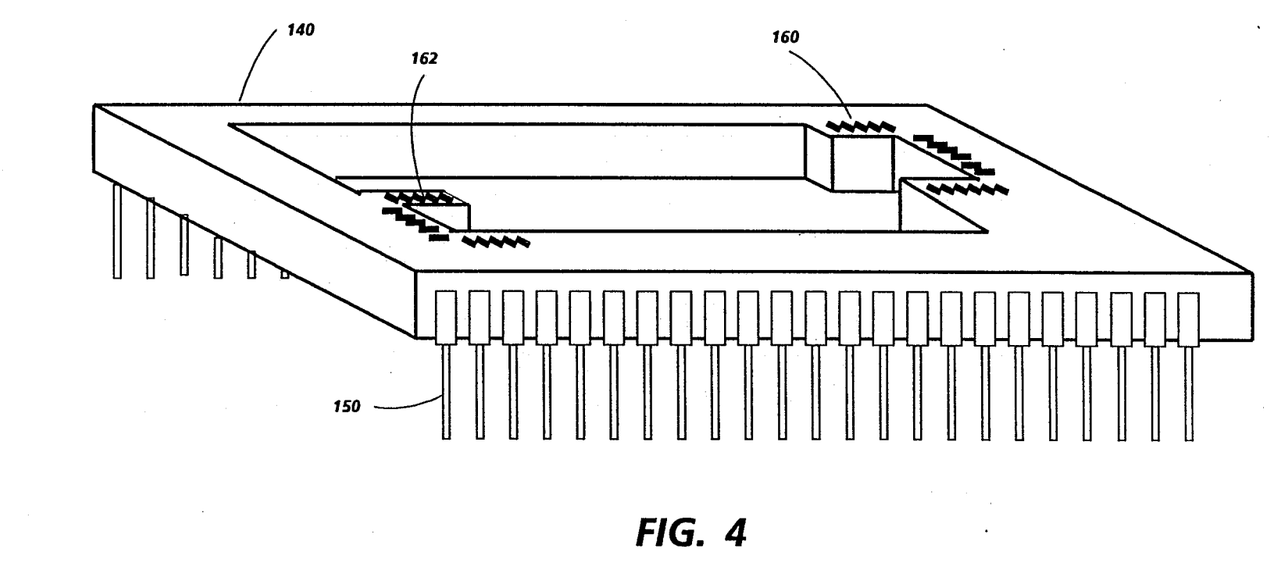
FIG. 4 is an isometric view of the package design for a two chip electro-optic modulator.

FIG. 4 of the present invention discloses an isometric view of the VLSI electro-optic modulator package shown schematically in FIG. 3. Mounted in the ceramic package 140 are the electrode connecting pads which would be individually connected to the pads on the integrated circuits. The connecting points on pad 160 would be connected to the complementary connecting points on the pads on integrated circuit 112. Similarly, the connecting points on pad 162 would be connected to the complementary connecting points on the pad on integrated circuit 110. The method of connecting the pads on the integrated circuit package 140 to the complementary points on the integrated circuits would be accomplished by most of the known integrated circuit manufacturing techniques.

Figure 5:
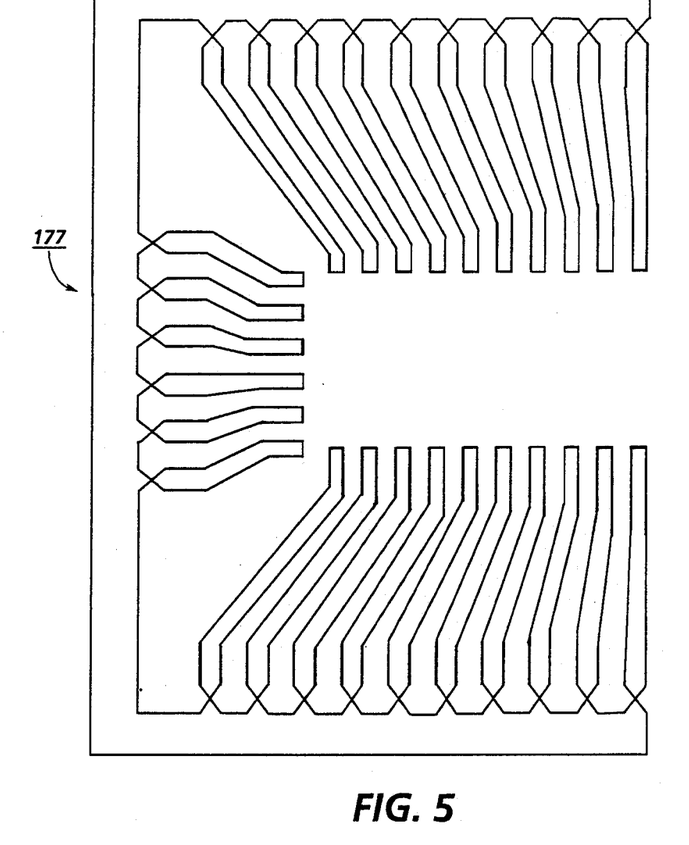
FIG. 5 is an enlarged view of the TAB cable used in the modulator set forth in FIG. 1.

FIG. 5 shows an enlarged view of the Tape Automated Bonding (TAB) interconnection cable. The use of a bumped tape is performed by first interconnecting the TAB cable to the chip so that all chip pads are interconnected to the cable 177. The chips are then aligned and glued to the glass/crystal assembly and glued in place with the glue, as set forth above. This subassembly is then placed into the VLSI package 180 (see FIG. 1B) and pressed against the elastomer 190 until the proper pressure is achieved. The crystal/glass assembly is then bonded to the top of the VLSI package with glue 182. The outer connections of the TAB cable 177 are then bonded to the interconnection pads on the VLSI package 140. An encapsulent 130 is then used to seal the pad area around the TAB cable to seal the VLSI device.

FIGS. 6A and 6B show the electro-optic crystal 100 would be glued to a glass backing 180 which provides protection and maintains the flatness of the electro-optic crystal 100. The integrated circuits 110 and 112 are aligned to a set of corresponding electrodes located on the crystal surface and should be as intimate as possible with the crystal 100 so as to allow the fringe fields established by the electrodes to affect as much as possible of the lithium niobate, or other, crystal. The integrated circuits once aligned are glued 185 in place to ensure that the integrated circuit electrodes maintain alignment with the crystal electrodes. The glue 185 used could be any quick curing glue with a low mobile ion content readily available in the marketplace. The wire bonds or TAB (Tape Automated Bonding) 177 are shown which would connect the electrical pads on the integrated circuits to the electrical pads on the integrated circuit package 140.

Figure 7A:
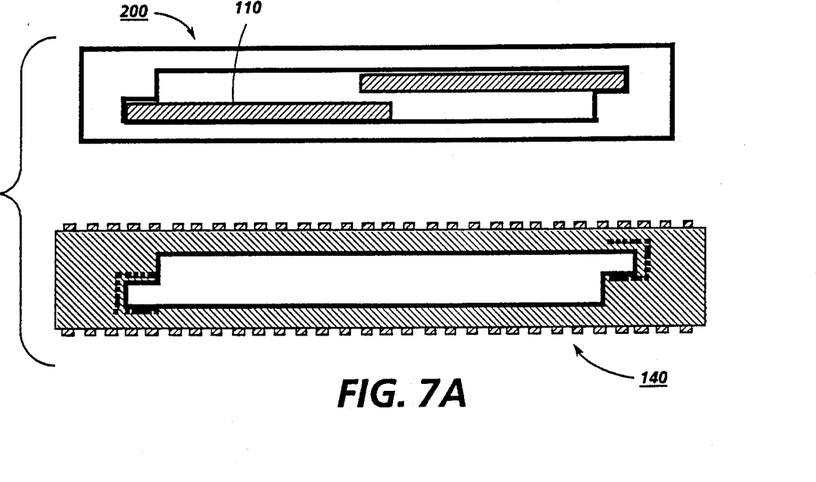
FIGS. 7A, 7B, and 7C are top and side views of another embodiment of the present invention showing the placement and use of a substrate.
Figure 7B:
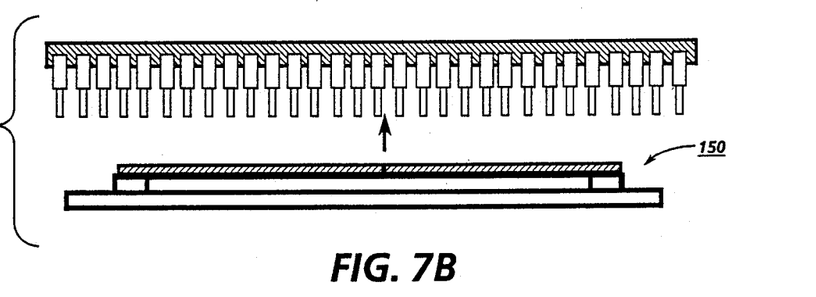
Figure 7C:
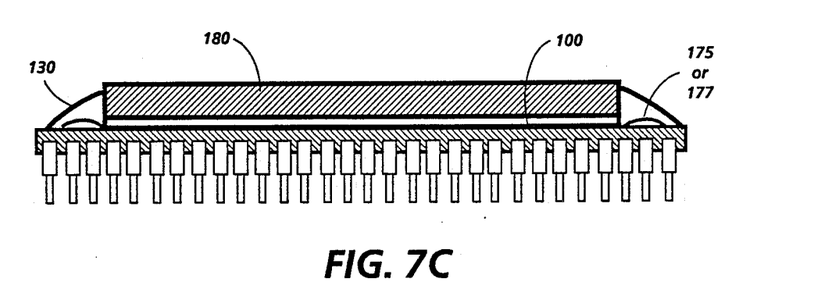

Yet another improvement to the present invention could utilize a VLSI package wherein the bottom plate of the package is non-existent. Thus, the LSI chip or chips 110, 112 are mounted on a suitably flat substrate 200 as shown in FIG. 7A and 7B. Then the crystal 100 could be aligned and pressed onto the chips as discussed above in relation to the other embodiments, FIG. 7C. In the above embodiments, the crystal/integrated circuits would have been pre-aligned and then inserted into an integrated circuit package on a layer of elastomer to ensure contact of all electrodes. Here, however, the integrated circuits/substrate is inserted into the hollow package (FIG. 7B) so just the edges thereof contact the edges of the open bottom area of the VLSI package. The crystal 100 is then aligned to the integrated circuits and pressed against them until all crystal and integrated circuit electrodes make contact. The encapsulent 130 is allowed to flow into the package ensuring permanent contact remains between the integrated circuits and the crystal after assembly.

While the invention has been described with reference to specific embodiments, it will be understood by those skilled in the art that various changes may be made and equivalents may be substituted for elements thereof without departing from the true spirit and scope of the invention. In addition, many modifications may be made without departing from the essential teachings of the invention.

What is claimed is:

1. A multi-gate electro-optic modulator constructed in an integrated circuit package comprising:
   an integrated circuit package comprising a flat upper surface and a hollow area located within said flat surface and accompanying electric signal lead connections emanating from within said hollow area of said integrated circuit package body,
   at least one first integrated circuit means mounted in the hollow area, said integrated circuit means including a plurality of electrically conductive electrodes in spaced apart relationship in a predetermined pattern and a plurality of electric lead connections connected to said lead connections of said package, said integrated circuit means being aligned in a predetermined aspect within said integrated circuit package,
   electro-optic element means mounted on said flat surface, and partially overlapping said hollow area of said package, containing electrically conductive electrodes which are adapted to contact the electrodes on said integrated circuit means so as to produce electric fields into said electro-optic element means, said electro-optic element means comprising a layer of optically transparent electro-optically responsive crystal,
   a layer of resilient compressed material between the bottom of the hollow area of said package and the bottom of said integrated circuit means for applying equal pressure to press the electrodes of the integrated circuit means and electro-optic element means into contact,
   a layer of glass or similar protection means mounted on the top surface of said electro-optic element means for protection of said electro-optic element means, and
   glue for cementing the edges of said crystal to the flat upper surface of said package.

2. The multi-gate electro-optic modulator as set forth in claim 1, further including encapsulant means being placed on and around said leads and the edges of said integrated circuit means.

3. The multi-gate electro-optic modulator as set forth in claim 2, wherein said crystal layer is intimately bonded to the surface of said integrated circuit means containing said electrically conductive electrodes, and said glass or similar protection means is intimately bonded to said crystal layer.

4. The multi-gate electro-optic modulator as set forth in claim 3, wherein said integrated circuit means is more or less aligned in the center of and longitudinally with said integrated circuit package.

5. The multi-gate electro-optic modulator as set forth in claim 4, wherein all of the electrical lead connections are at one end of said integrated circuit means.

6. A multi-gate electro-optic modulator constructed in an integrated circuit package comprising:
   an integrated circuit package comprising a flat upper surface and a hollow area comprising a flat bottom located within said flat surface and accompanying electric signal lead connections emanating from within said hollow area of said integrated circuit package body,
   at least one first integrated circuit means mounted in the hollow area, said integrated circuit means comprising an upper surface, a plurality of electrically conductive electrodes in spaced apart relationship in a predetermined pattern and a plurality of electric lead connections connected to said lead connections of said package, said integrated circuit means being aligned in a predetermined aspect within said integrated circuit package,
   electro-optic element means having a flat top mounted on said flat surface, and partially overlapping said hollow area of said package, containing electrically conductive electrodes which are adapted to contact the electrodes on said integrated circuit means so as to produce electric fields into said electro-optic element means, said electro-optic element means comprising a layer of optically transparent electro-optically responsive crystal,
   a layer of resilient compressed material between the bottom of the hollow area of said package and the bottom of said integrated circuit means for biasing the electrodes of the integrated circuit means and electro-optic element means into contact,
   a layer of glass or similar protection means mounted on the top surface of said electro-optic element means for protection of said electro-optic element means, and
   glue for cementing said crystal to the flat upper surface of said package,
   further including encapsulant means being placed on and around said leads and between said leads and said electro-optic element means,
   wherein said crystal layer is intimately bonded to said upper surface of said integrated circuit means containing said electrically conductive electrodes, and said glass or similar protection means is intimately bonded to said crystal layer,
   further including a second integrated circuit means mounted in the hollow body of said integrated circuit package, said first and second integrated circuit means being mounted essentially longitudinally in said integrated circuit package, such that said first integrated circuit means and said second integrated circuit means are almost end to end from one another, but offset slightly from the center of said integrated circuit package.

7. The multi-gate electro-optic modulator as set forth in claim 6, wherein the ends of said first and second integrated circuit means overlap somewhat in their offset positions in said integrated circuit package.

8. The multi-gate electro-optic modulator as set forth in claim 7, wherein the electrical pads of said electrically conductive electrodes on said first and second integrated circuit means are at opposite ends of said integrated circuit package.

* * * * *